(12) United States Patent
Chakraborty et al.

(10) Patent No.: US 10,667,422 B2
(45) Date of Patent: *May 26, 2020

(54) SELECTIVELY INSTALLABLE AND REMOVABLE AUXILIARY WIRING DEVICE FOR I/O MODULE

(71) Applicant: Rockwell Automation Asia Pacific Business Center Pte. Ltd., Singapore (SG)

(72) Inventors: Rajiv Chakraborty, Singapore (SG); Srinivasan Melkote, Singapore (SG); Terence S. Tenorio, Aurora, OH (US); Douglas A. Lostoski, Richfield, OH (US); David S. Wehrle, Chesterland, OH (US); Adam M. Wrobel, Gates Mills, OH (US)

(73) Assignee: Rockwell Automation Asia Pacific Business Center Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/259,627

(22) Filed: Jan. 28, 2019

(65) Prior Publication Data

US 2019/0159357 A1 May 23, 2019

Related U.S. Application Data

(63) Continuation of application No. 15/810,025, filed on Nov. 11, 2017, now Pat. No. 10,194,553.

(51) Int. Cl.
*H05K 7/14* (2006.01)
*H05K 7/02* (2006.01)
(Continued)

(52) U.S. Cl.
CPC ......... *H05K 7/1468* (2013.01); *H01R 9/2675* (2013.01); *H01R 13/6272* (2013.01);
(Continued)

(58) Field of Classification Search
CPC .... H05K 7/1468; H05K 7/1469; H05K 7/026; H05K 7/1438; H01R 13/6272; H01R 9/2675; H01R 4/4836; H01R 12/515
See application file for complete search history.

(56) References Cited

U.S. PATENT DOCUMENTS 4,872,855 A  10/1989 Norden
5,148,353 A * 9/1992 Morgan ................. G06F 1/183
361/726
(Continued)

OTHER PUBLICATIONS

Extended European Search Report dated Apr. 1, 2019 for Application No. 18204672.2.
(Continued)

*Primary Examiner* — Abhishek M Rathod
(74) *Attorney, Agent, or Firm* — Fay Sharpe LLP

(57) ABSTRACT

A modular I/O device includes a terminal base with a terminal block that includes a plurality of wiring connectors. An auxiliary wiring device includes a plurality of auxiliary wiring connectors and is selectively physically connectable to the terminal base in an operative position and selectively physically removable from the terminal base. The terminal block includes a receiver and the auxiliary wiring device includes a body including at least one mounting tab that projects outwardly from the body and that is located in the receiver. The receiver includes a projecting lip about which the auxiliary wiring device is pivotable relative to the receiver on a pivot axis. The terminal base includes at least one catch and the auxiliary wiring device further includes at least one latch arm that is adapted to engage the catch when
(Continued)

the auxiliary wiring device is physically connected to said terminal base in its operative position.

7 Claims, 9 Drawing Sheets

(51) Int. Cl.
*H01R 9/26* (2006.01)
*H01R 13/627* (2006.01)
*H01R 12/51* (2011.01)
*H01R 4/48* (2006.01)

(52) U.S. Cl.
CPC ........... *H05K 7/026* (2013.01); *H05K 7/1438* (2013.01); *H05K 7/1469* (2013.01); *H01R 4/4836* (2013.01); *H01R 12/515* (2013.01)

(56) References Cited

U.S. PATENT DOCUMENTS

| | | | |
|---|---|---|---|
| 5,253,140 A | 10/1993 | Inoue et al. | |
| 5,302,136 A | 4/1994 | St. Germain et al. | |
| 5,615,079 A | 3/1997 | Eggert et al. | |
| 6,027,379 A | 2/2000 | Hohorst | |
| 6,033,268 A | 3/2000 | Piper et al. | |
| 6,654,255 B2* | 11/2003 | Kruse | H04Q 1/116 174/480 |
| 7,753,739 B2 | 7/2010 | Bentler et al. | |
| 9,055,688 B2 | 6/2015 | Molnar et al. | |
| 9,325,110 B2 | 4/2016 | Lostoski et al. | |
| 9,532,479 B2 | 12/2016 | Hamada et al. | |
| D792,857 S | 7/2017 | Molnar | |
| 9,966,714 B1 | 5/2018 | Sreedharan et al. | |
| 2009/0257173 A1 | 10/2009 | Rane et al. | |
| 2010/0240237 A1 | 9/2010 | Beyer et al. | |
| 2013/0027890 A1* | 1/2013 | Berger | H05K 7/1468 361/747 |
| 2013/0254447 A1 | 9/2013 | Molnar et al. | |
| 2014/0194007 A1* | 7/2014 | Cech | H01R 9/2675 439/631 |
| 2015/0244107 A1 | 8/2015 | Lostoski et al. | |
| 2016/0283427 A1 | 9/2016 | Chaudhari et al. | |
| 2016/0349721 A1 | 12/2016 | Kang | |

OTHER PUBLICATIONS

Hope, Roger et al., *Control System Grounding—Part 2: Ground Wiring, Shield Grounds, and Power Supply Grounding*, EE Times, Jul. 15, 2008.
Pamphlet titled *Module carriers, Node services carrier*, 8712-CA-NS, GE, www.ge-ip.com/process, 2010.
Pamphlet titled *Kit Installation Instruction*, Siemens Moore Process Automation, Inc., 15900-560, Rev: 2, Dec. 2000.
DeltaV Distributed Control Systems—Product Data Sheet titled *S-series Horizontal Carriers*, Emerson, Aug. 2017.

* cited by examiner

SELECTIVELY INSTALLABLE AND REMOVABLE AUXILIARY WIRING DEVICE FOR I/O MODULE

CROSS REFERENCE TO RELATED APPLICATION

This application is a continuation of co-pending U.S. application Ser. No. 15/810,025 filed Nov. 11, 2017, and the entire disclosure of said prior application Ser. No. 15/810,025 is hereby expressly incorporated by reference into the present specification.

BACKGROUND INFORMATION

Modular input/output (I/O) systems for industrial automation control systems are well-known and in widespread use. Referring to FIG. 1, a known modular I/O system MIO' includes a network adapter module AM' that is operatively connected to an industrial automation network N so that the network adapter module AM' receives data from, transmits data to, and otherwise communicates with an industrial control module or "controller" C also connected to the network N.

The adapter module AM' is mounted to a DIN rail D or other support structure. One or more terminal base units TB' (TB1',TB2',TB3', etc.) are also mounted to the DIN rail D, with a first terminal base unit TB1' located adjacent and operably physically and electrically connected to the network adapter module AM' and with the additional terminal base units TB2',TB3' operably physically and electrically connected together one after the other in a sequential manner such that a modular backplane circuit for communicating electrical power and data (referred to as a "backplane") is constructed through the successively connected terminal base units TB' and operably connects each terminal base unit TB' to the adapter module AM' and, thus, to the controller C.

Each terminal base unit TB' (sometimes referred to simply as a "terminal base") includes a terminal block BK' comprising a plurality of cage clamps, spring clamps, screw terminals, or other wiring connectors WC' that are adapted to be connected to field cables or field wires FW that are each associated with a field device FD that is typically an analog or digital device such as a sensor, switch, probe, thermocouple, RTD, encoder, or the like that is associated with the process or machine being controlled (the controlled system CS) by the controller C. The terminal block BK' is typically a separate structure that is assembled to the terminal base TB' but the terminal block BK' can alternatively be defined as an integral or one-piece part of the terminal base TB'. Different varieties of terminal blocks BX' can be used depending upon the particular configuration required for the field device wiring connectors WC', with some having different common terminals, ground connections, voltage supply terminals, and the like.

A respective I/O module M' is operatively removably connected to each terminal base TB' such that the installed I/O module M' communicates with the field device wiring connectors WC' of the corresponding terminal base TB' to which the I/O module M' is physically connected, and the I/O module M' also communicates with the network adapter module AM' (and from there to the industrial automation controller C) over the backplane circuit such that input/output data is provided between the controller C and field device(s) FD connected to the corresponding terminal base TB'. Each I/O module M' is selected and configured to perform one or more specialized input/output functions such as DC input, DC output, AC input, AC output, analog input and/or output, RTD and/or thermocouple input and/or thermocouple output, or the like.

In certain instances, a terminal block BK' lacks the required number and/or type of wiring connectors WC' necessary to complete the wiring for one or more associated field devices FD. In such case, using presently known systems, it is necessary for an end user to install a separate auxiliary wiring connector device XD' as near as possible to the relevant terminal base TB'. In this known arrangement, the auxiliary wiring connector device XD' is separate and spaced-apart from the terminal block BK' and is provided with the necessary power, ground, or other auxiliary wiring connections XC'. One or more of the auxiliary wiring connectors XC' is connected to an auxiliary input or output connection AX such as a ground path, a voltage supply, a conditioning circuit, or the like. The field device wiring or related cabling/wiring must be lengthened and/or otherwise routed to mate with the wiring connections XC' of the separate auxiliary wiring device XD' (see field wires FW') which makes the wiring system more complicated and less efficient. Also, the use of such a separate auxiliary wiring connector device XD' makes it more difficult for maintenance and service personnel to understand the original wiring pattern and to duplicate same as needed after removal and replacement of a defective terminal base TB'. Accordingly, a need has been identified for an auxiliary wiring device that overcomes these and other deficiencies while providing better overall results.

SUMMARY

In accordance with one aspect of the present development, a modular I/O device includes a terminal base including a terminal block. The terminal block includes a plurality of wiring connectors adapted for connection to associated field device wires. An auxiliary wiring device includes a plurality of auxiliary wiring connectors adapted for connection to associated field device wires. The auxiliary wiring device is selectively physically connectable to said terminal base in an operative position and selectively physically removable from said terminal base.

In accordance with another aspect of the present development, the terminal block includes a receiver and the auxiliary wiring device includes a body including at least one mounting tab that projects outwardly from the body, wherein the at least one mounting tab is located in the receiver when the auxiliary wiring device is connected to the terminal base.

In accordance with a further aspect of the present development, the receiver comprises an open pocket into which the at least one mounting tab is inserted. The receiver includes a projecting lip with a tip that is abutted with an inner face of the at least one mounting tab. The tip of the projecting lip of the receiver and the inner face of the at least one mounting tab comprise respective cylindrical surfaces that are abutted with each other when the auxiliary wiring device is connected to the terminal base such that the abutted cylindrical surfaces provide a pivoting hinge interface about which the auxiliary wiring device is pivotable relative to the receiver on a pivot axis.

In accordance with another aspect of the present development, the terminal base includes at least one catch, and wherein the body of said auxiliary wiring device further includes at least one latch arm connected thereto that is adapted to mate with and engage the at least one catch when the auxiliary wiring device is physically connected to said terminal base in its operative position.

In accordance with a further aspect of the present development, the at least one latch arm comprises a resiliently flexible latch arm including a locking projection that is adapted to engage the at least one catch when the at least one latch arm is mated with the at least one catch. The at least one catch comprises: (i) a slot located in a bottom wall of the terminal base that is adapted to receive the at least one latch arm. The catch includes a transverse catch face that intersects the slot. The at least one latch arm is received in the slot and the locking projection thereof engages the transverse catch face when the at least one latch arm is mated with the at least one catch.

In one embodiment, the at least one latch arm includes a resiliently flexible stem that projects outwardly from the body, and the locking projection is located at an outer end of the stem spaced from the body. The locking projection includes: (i) an inclined ramp face that diverges away from the stem as the inclined ramp face extends from the outer end of the stem toward the body; and, (ii) a transverse lock face that connects an inner end of the inclined ramp face to the stem.

In accordance with another aspect of the present development, at least some of the auxiliary wiring connectors of the auxiliary wiring device are electrically interconnected in common with each other.

In accordance with a further aspect of the present development, the body of the auxiliary wiring device also includes a tool recess that is adapted to receive an associated tool used to pivot the auxiliary wiring device about the pivot axis from the operative position toward the installation position.

DETAILED DESCRIPTION

Figure 1:
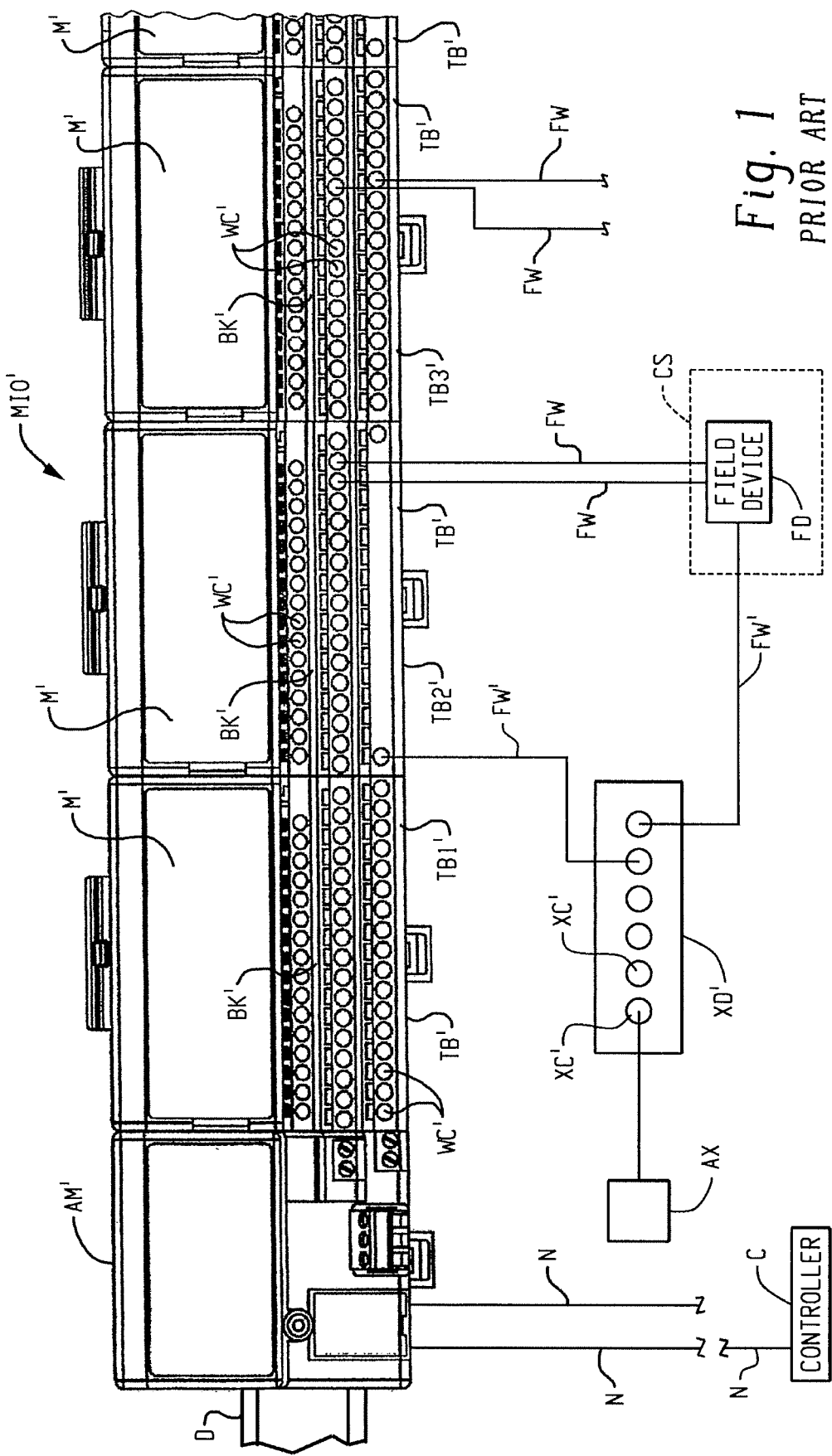
FIG. 1 (prior art) is a front view of a known modular input/output (I/O) system.
Figure 2:
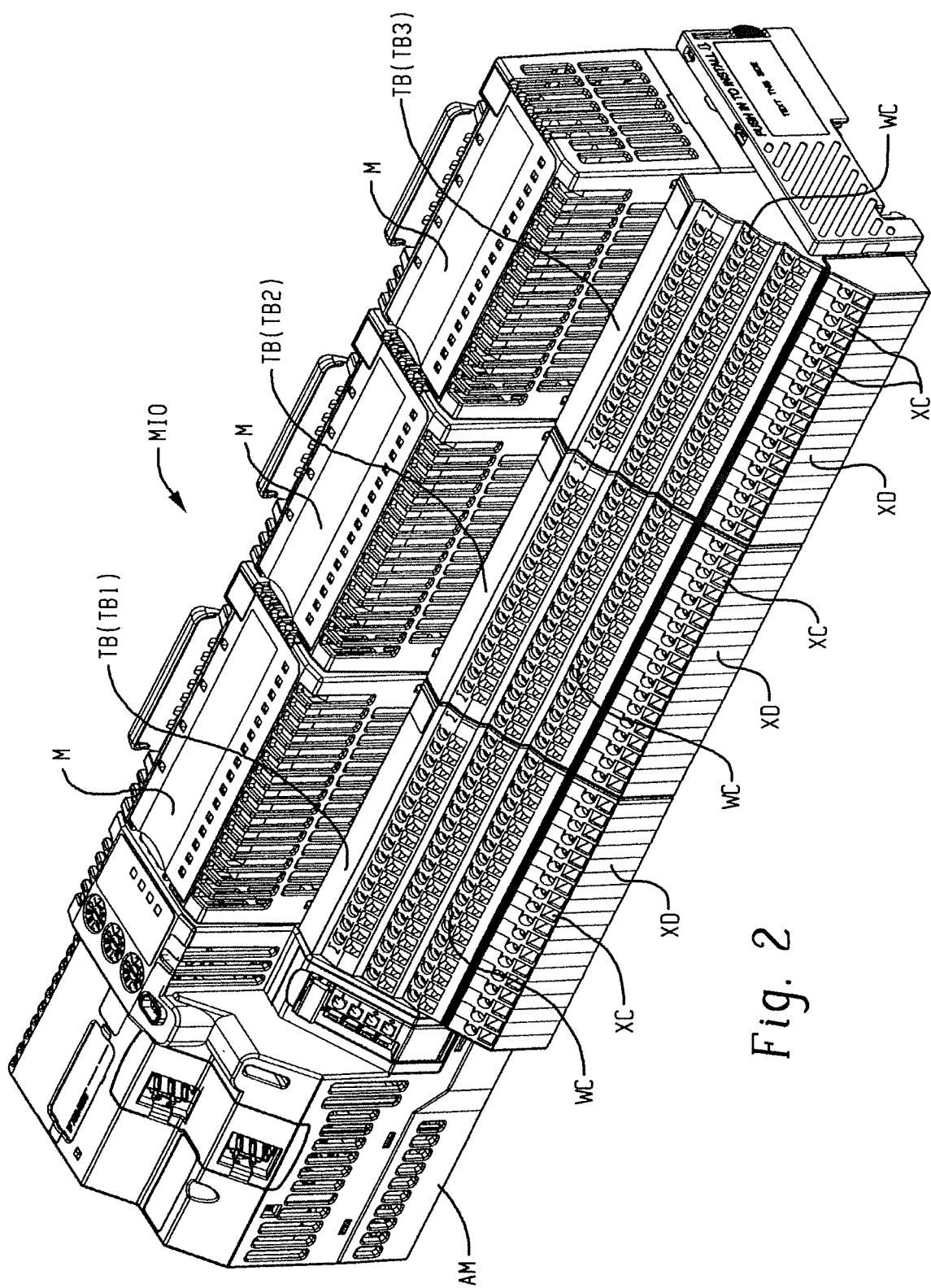
FIG. 2 is an isometric view of a modular input/output (I/O) system provided in accordance with an embodiment of the present development to include at least one selectively installable and removable auxiliary wiring device.

FIG. 2 is an isometric view of a modular input/output (I/O) system MIO including at least one selectively installable and removable auxiliary wiring device XD in accordance with an embodiment of the present development. Except as otherwise shown and/or described herein, the modular I/O system MIO of FIG. 2 is similar to the modular I/O system MIO' of FIG. 1, and like components of the modular I/O system MIO relative to the modular I/O system MIO' of FIG. 1 are identified with like reference characters that omit the primed (') designation, and in some cases such like components are not described in their entirety again here.

The modular input/output (I/O) systems MIO includes a network adapter module AM and includes one or more terminal base units TB (TB1,TB2,TB3, etc.) operably connected to the adapter module AM. The adapter module AM is operatively connected to an industrial automation network N (FIG. 1) so that the network adapter module AM receives data from, transmits data to, and otherwise communicates with an industrial control module or "controller" C also connected to the network N. A first terminal base unit TB1 is located adjacent and operably physically and electrically connected to the network adapter module AM and the additional terminal base units TB2,TB3 are operably physically and electrically connected together one after the other in a sequential manner such that a modular backplane circuit for communicating electrical power and data (referred to as a "backplane") is constructed through the successively connected terminal base units TB and operably connects each terminal base unit TB to the adapter module AM and, thus, to the associated industrial controller C to which the adapter module AM is operable connected.

Figure 3:
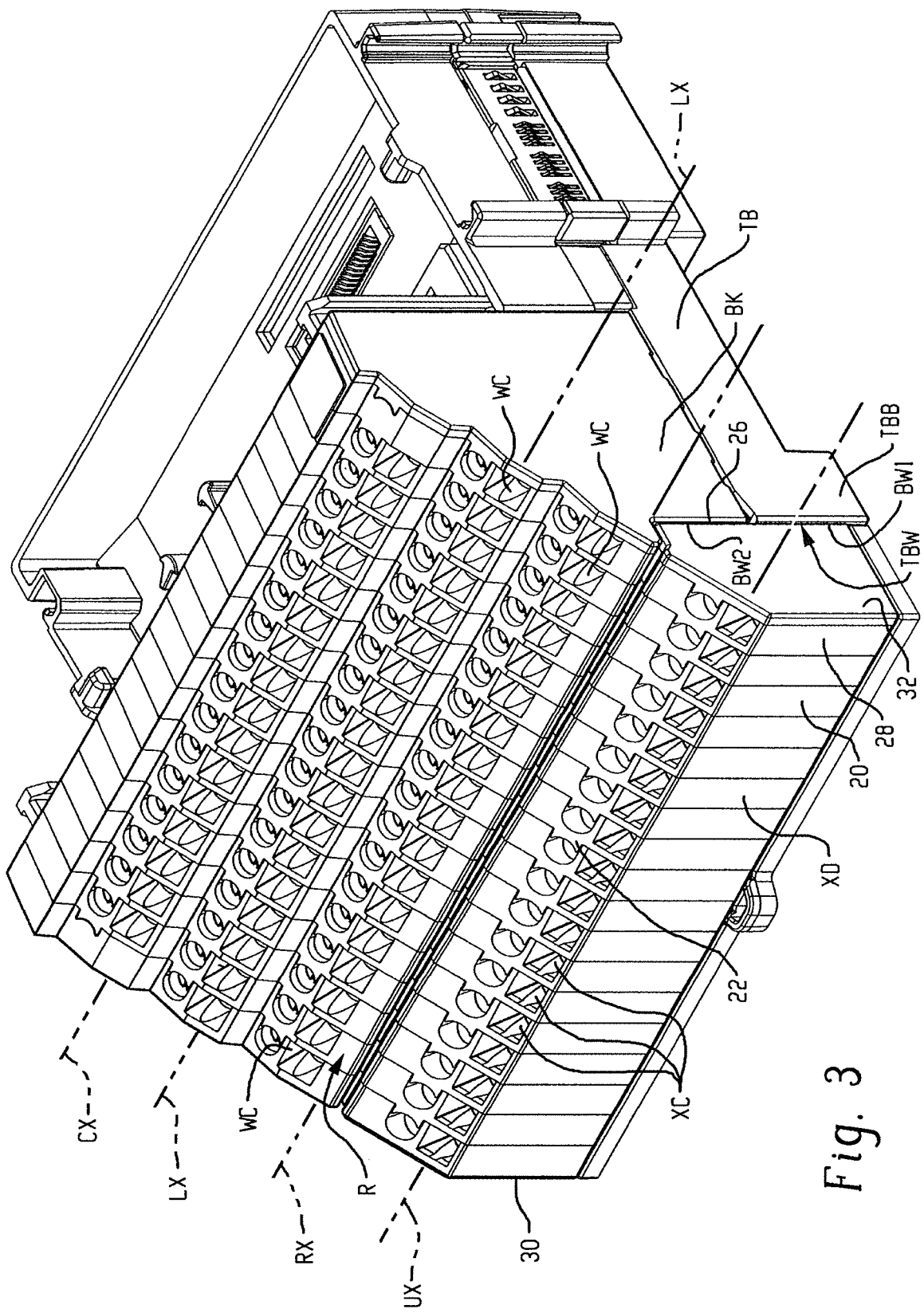
FIG. 3 is an isometric view of a single terminal base of the I/O system of FIG. 2 (without including its associated I/O module connected thereto) including a selectively installable and removable auxiliary wiring device according to the present development.
Figure 4:
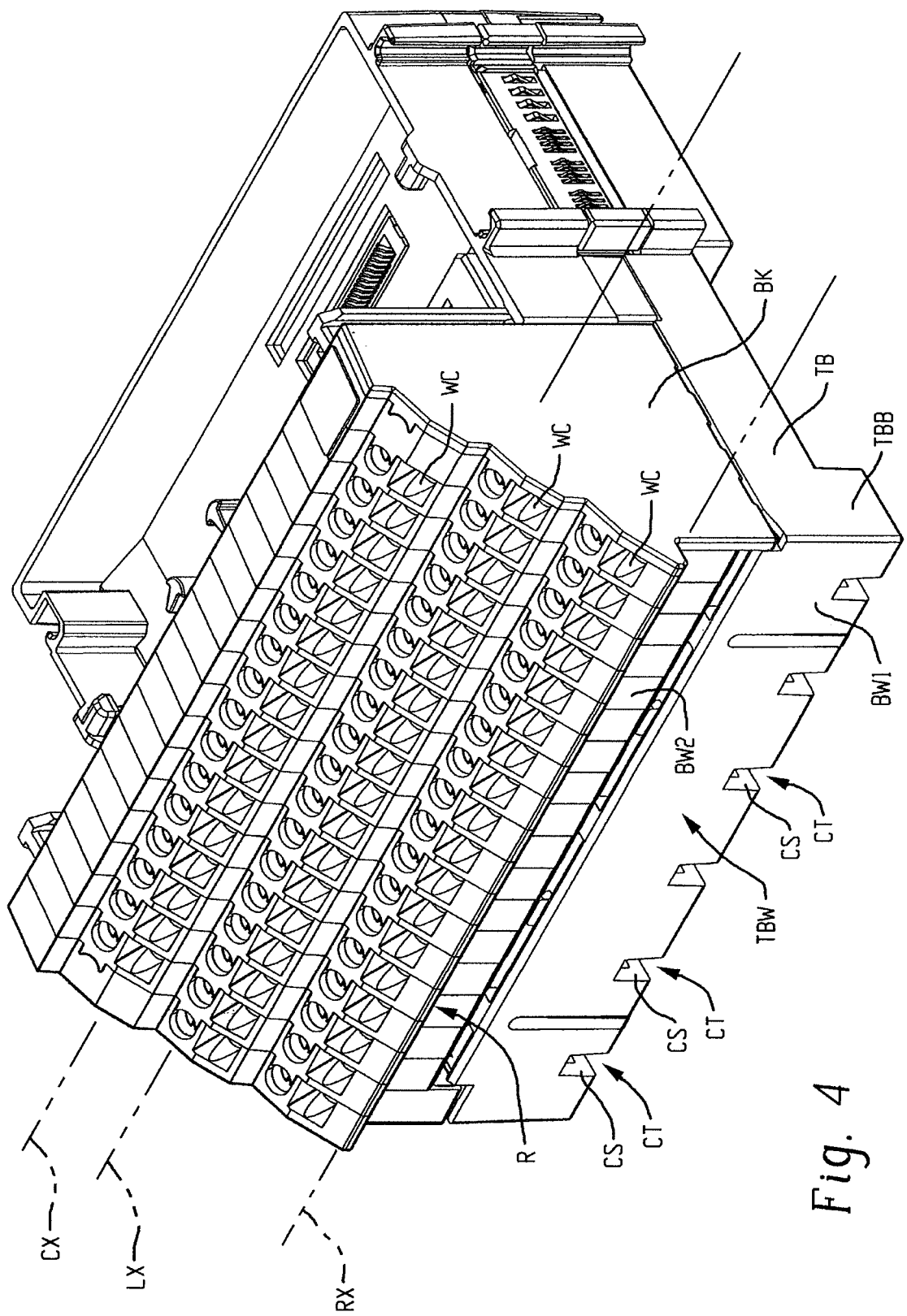
FIG. 4 is similar to FIG. 3 but shows the terminal base without the auxiliary wiring device installed.
Figure 5:
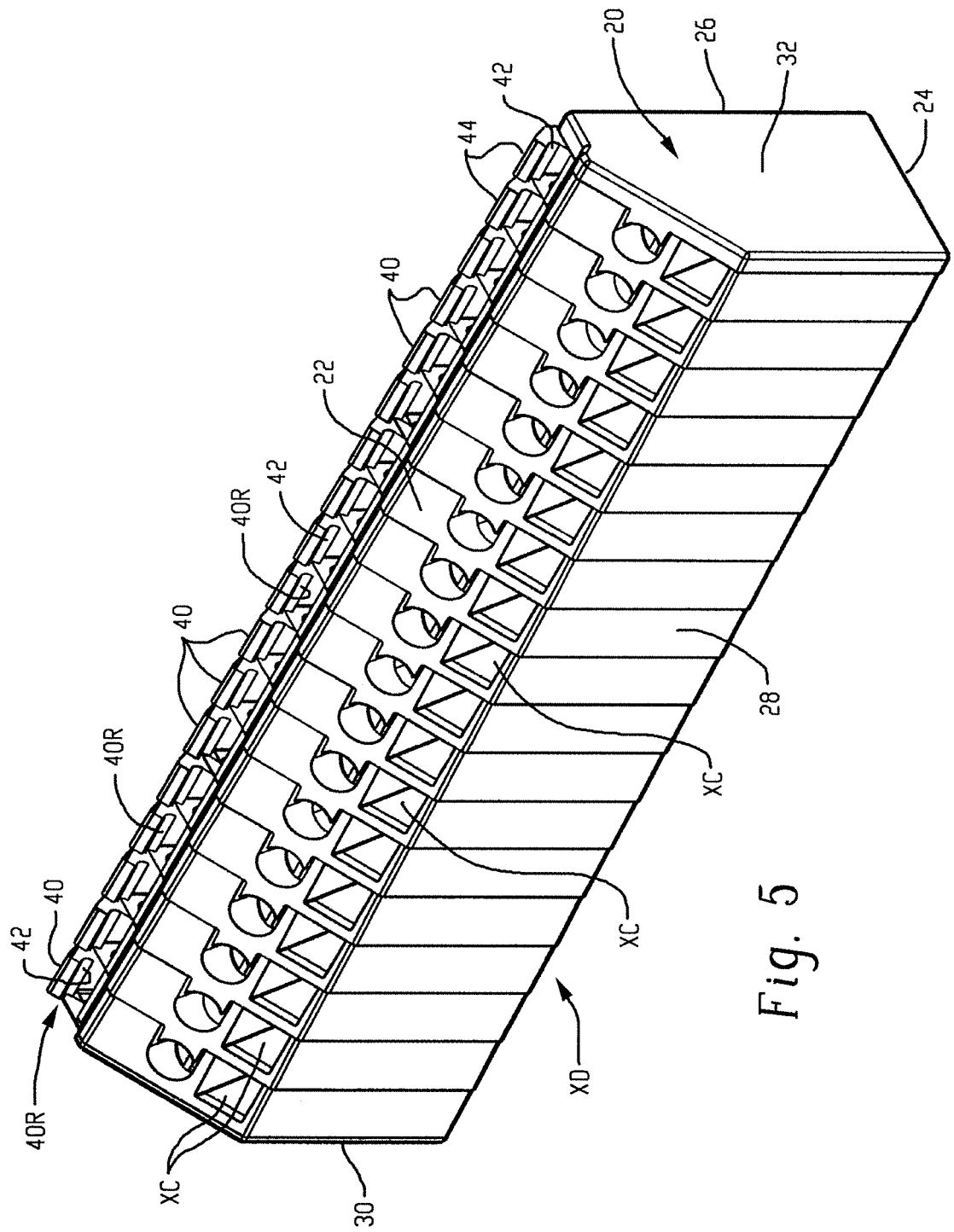
FIG. 5 is a front isometric view of the selectively installable and removable auxiliary wiring device by itself.
Figure 6D:
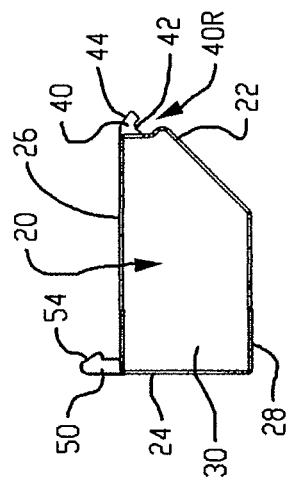
FIGS. 6A, 6B, 6C, 6D, and 6E are respective front, top, bottom, left side, and right side views of the auxiliary wiring device shown in FIG. 5.
Figure 6E:
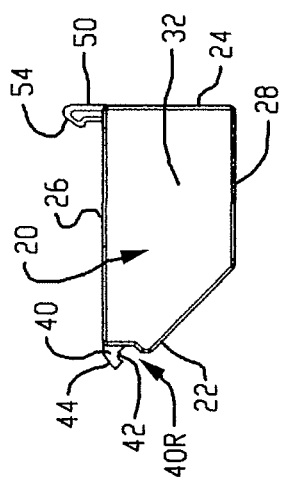
Figure 6B:
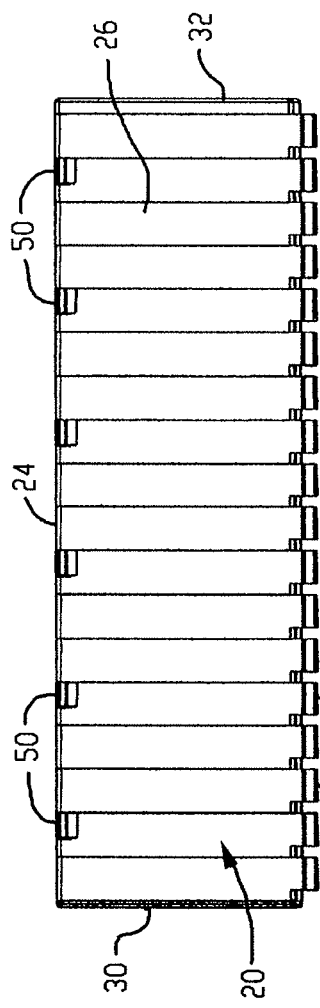
Figure 6A:
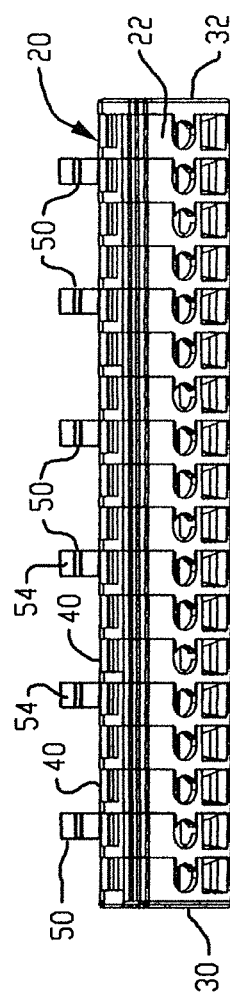
Figure 6C:
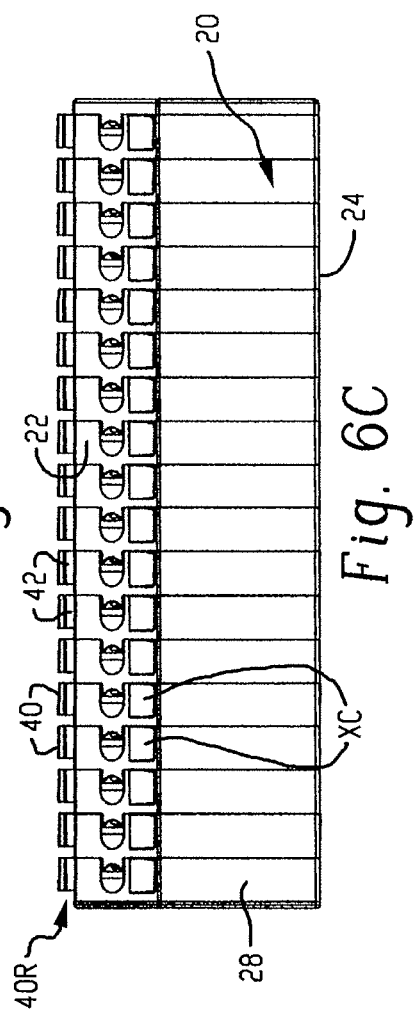

Referring also to FIGS. 3 & 4, each terminal base unit TB (sometimes referred to simply as a "terminal base") includes a main body TBB and includes a terminal block BK that is connected to the main body TBB or that is defined as a part of the main body TBB. The terminal block BK comprises a plurality of cage clamps, spring clamps, screw terminals, or other wiring connectors WC that are adapted to be connected to field cables or field wires FW that are each associated with a field device FD that is typically an analog or digital device such as a sensor, switch, probe, thermocouple, RTD, encoder, or the like that is associated with the process or machine being controlled (the controlled system CS) by the controller C (see also FIG. 1). The wiring connectors WC are arranged in respective rows that each extend laterally along a connector axis CX that lies parallel to a longitudinal axis LX of the terminal block BK, and the longitudinal axis LX of the terminal block typically lies parallel to the DIN rail or other mounting structure to which the terminal base TB is operatively connected during use. As shown in FIG. 4, the terminal base TB comprises a bottom wall TBW that partially defined by a bottom wall BW1 of the main body TBB and partially defined by a bottom wall W2 of the terminal block BK.

A respective I/O module M (shown in FIG. 2 but not in FIGS. 3 & 4) is operatively removably connected to each terminal base TB such that the installed I/O module M communicates with the field device wiring connectors WC of the corresponding terminal base TB to which the I/O module M is physically connected, and the I/O module M also communicates with the network adapter module AM (and from there to the industrial automation controller C) over the backplane circuit such that input/output data is provided between the controller C and field device(s) FD connected to the corresponding terminal base TB. Each I/O module M is selected and configured to perform one or more specialized input/output functions such as DC input, DC output, AC input, AC output, analog input and/or output, RTD and/or thermocouple input and/or thermocouple output, or the like.

As noted above, in certain instances, a terminal block BK lacks the required number and/or type of wiring connectors WC necessary to complete the wiring for one or more associated field devices FD. Unlike the known modular I/O system MIO' of FIG. 1, the system MIO of FIG. 2 comprises at least one selectively installable and removable auxiliary wiring device XD that, when installed as shown in FIGS. 2 and 3, is mechanically or physically engaged with and connected to a corresponding terminal base TB. The auxiliary wiring device XD comprises a plurality of auxiliary wiring connectors XC for being connected to one or more of the field wires FW and/or for being connected to an auxiliary input or output connection AX (FIG. 1) such as a ground path, a voltage supply, a conditioning circuit, or the like. In one embodiment, all of the auxiliary wiring connectors XC are electrically connected in common with each other such that a connection of one of the auxiliary wiring connectors XC to the auxiliary input or output connection AX (e.g., an electrical ground path connection) connects all of the auxiliary wiring connectors XC to the auxiliary input or output connection. In an alternative embodiment, at least one of the auxiliary wiring connectors XC is not electrically connected in common with the other auxiliary wiring connectors XC. As shown in FIG. 4, the auxiliary wiring device XD is selectively removable from the terminal base TB when not needed or desired.

FIGS. 5 and 6A-6E show the selectively installable and removable auxiliary wiring device XD by itself. The auxiliary wiring device XD comprises a molded polymeric or otherwise constructed body 20 including the plurality of auxiliary wiring connectors XC. As noted above, one or more (or all) of the plurality of auxiliary wiring connectors can be electrically connected together to provide a common electrical connection point. The body includes a front wall 22, a rear wall 24, a top wall 26, a bottom wall 28, and opposite left and right lateral side walls 30,32. When the auxiliary wiring device XD is installed on a terminal base as shown in FIG. 3, the top wall 26 is abutted with the bottom wall TBW of the terminal base TB. The auxiliary wiring connectors XC are located in the front wall 22 of the body 20. The body 20 can be constructed as one piece or, as shown herein, assembled from two or more pieces that are interconnected to define the body 20.

Adjacent the intersection of the front wall 22 and the top wall 26, the body 20 comprises at least one and preferably at least two mounting tabs 40 that project outwardly from the front wall 22. In the illustrated embodiment, a plurality of mounting tabs 40 are provided and are evenly spaced across the width of the body 20 between the left and right side walls 30,32 adjacent the intersection of the front wall 22 and top wall 26. With reference also to the enlarged views of FIGS. 7A-7C, each mounting tab 40 includes an inner face 42 oriented toward the auxiliary wiring connectors XC, and the inner face 42 is concave such that a mounting tab recess 40R is defined between each mounting tab 40 and the front wall 22. At least part of the inner face 42 preferably comprises a cylindrical surface 42c (See FIG. 7A). Each mounting tab 40 further comprises an outer face 44 located on the side opposite the inner face 42 and facing in the opposite direction as compared to the inner face 42. The outer face 44 of each mounting tab 40 is angled or otherwise transversely oriented with respect to the top wall 26.

The body 20 of the auxiliary wiring device XD further comprises at least one and preferably at least two or more latch arms 50 that project outwardly from the body 20. In the example of the illustrated embodiment, the body includes a plurality of latch arms 50 spaced evenly across its width between the left and right side walls 30,32, with the latch arms projecting outwardly from the top wall 26 adjacent the intersection of the top wall 26 with the rear wall 24. Referring also to the enlarged views of FIGS. 7A-7C, each latch arm 50 comprises a resiliently flexible shaft or stem 52 that projects outwardly from the top wall 26, and includes an enlarged locking projection 54 connected to an outer end 52e of the stem 52 that is spaced from the top wall 26. As shown herein, the locking projection 54 comprises an inclined ramp face 54r that diverges away from the stem 52 as it extends from an outer end of the ramp face 54r located adjacent the outer end 52e of the stem 52 toward an inner end of the ramp face 54r that is located closer to the top wall 26 of the body 20 as compared to the outer end of the ramp face. The locking projection 54 further comprises a transverse lock face 54f that is oriented perpendicularly or otherwise transversely oriented relative to the stem 52 and that connects the inner end of the ramp face 54r to the stem 52 at a location between the top wall 26 of the body 20 and the outer end 52e of the stem 52. Each latch arm 50 is resiliently elastically deflectable at least toward and away from the front and back walls 22,24.

Figure 7A:
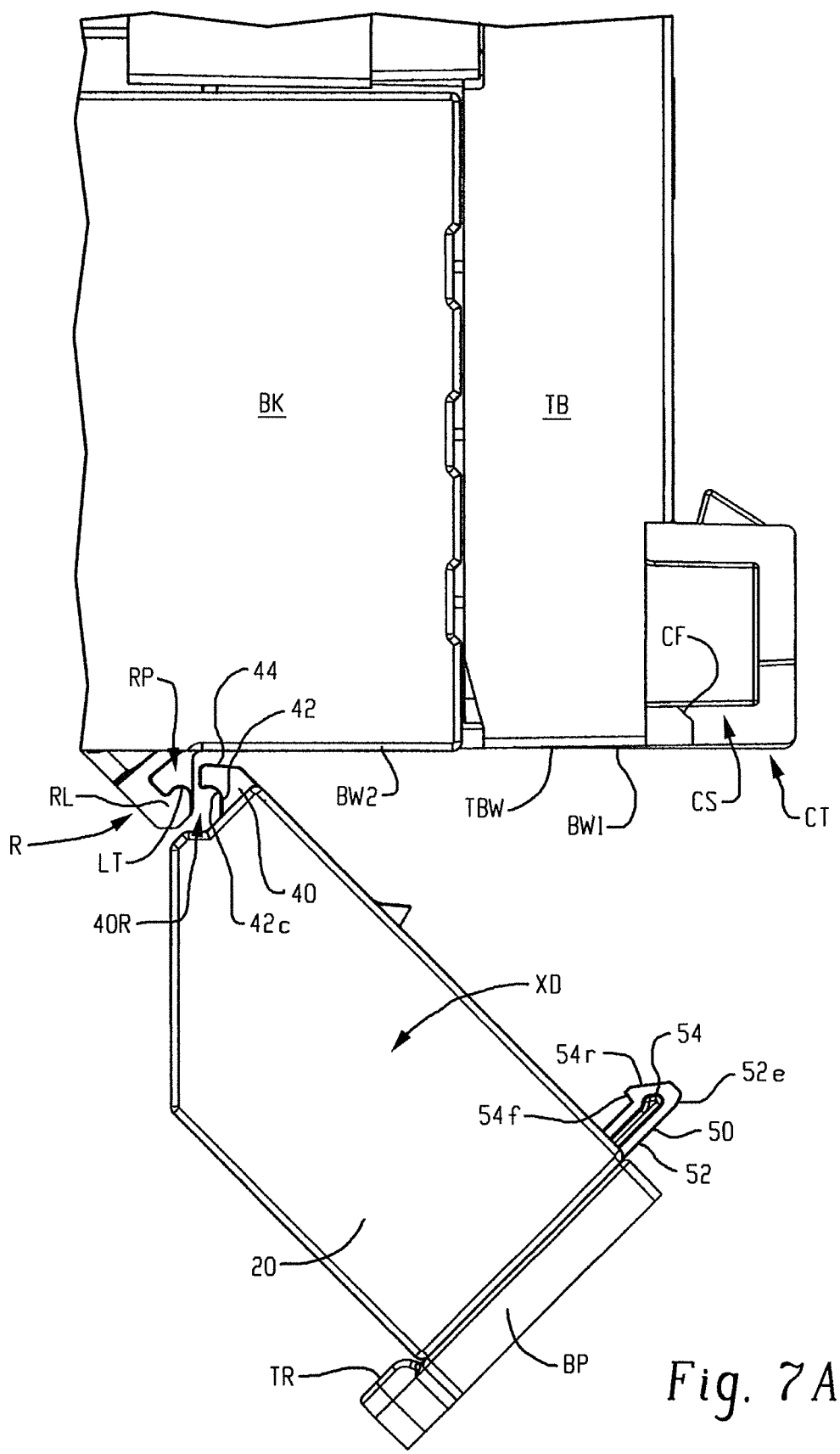
FIGS. 7A, 7B, and 7C are simplified side section views that respectively illustrate first, second, and third steps of a process for selectively installing the auxiliary wiring device of FIG. 5 on a terminal base according to the present development (the process for removing the auxiliary wiring device from the terminal base comprises performing the first, second, and third steps in the reverse order).
Figure 7B:
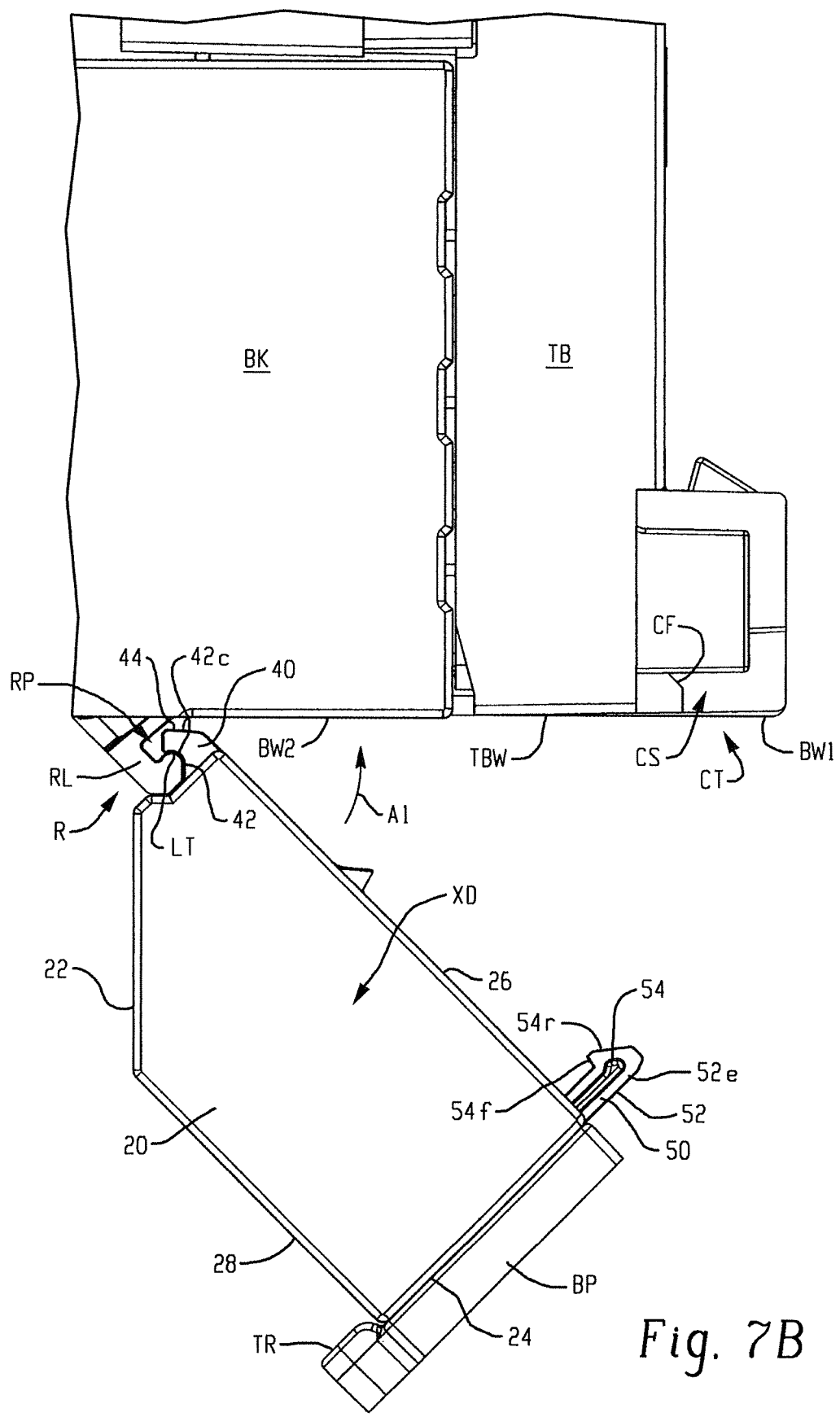

Referring to FIGS. 3, 4 and 7A-7C, the terminal block BK of the terminal base TB includes a receiver portion or receiver R adapted to receive the mounting tabs 40 of the body 20 of the auxiliary wiring device XD such that the auxiliary wiring device 20 is engaged with and pivotable relative to the terminal base TB when the mounting tabs 40 are received in and engaged with the receiver portion R. The receiver R is located adjacent the terminal base bottom wall TBW and, in the illustrated embodiment the receiver is connected to the terminal block BK and located adjacent the bottom wall BW2 of the terminal block BK. More particularly, the receiver R comprises a recess or pocket RP that can comprise a single open space adapted to receive all of the mounting tabs 40 or can comprise a plurality of separate individual adjacent pocket spaces separated by divider walls, wherein each of individual pocket space is adapted to receive a respective one of the mounting tabs 40. In either case, the receiver comprises a projecting lip RL including a tip LT comprising a cylindrical surface centered on a receiver axis RX (FIGS. 3 & 4) that extends parallel to longitudinal axis of the terminal block BK. The cylindrical surface of the tip LT is preferably formed with a radius that matches the radius of the cylindrical surface 42c of each mounting tab 40. As shown in FIGS. 7A & 7B, when a mounting tab 40 of the auxiliary wiring device 20 is inserted into the receiver pocket RP, the tip LT is received in the mounting tab recess 40R and the cylindrical surface of the tip LT is abutted with the mutually corresponding cylindrical portion 42c of the concave inner face 42 of each mounting tab 40 to provide a pivoting hinge interface between each mounting tab 40 and the projecting lip RL of the receiver pocket. When the tip LT is located in the mounting tab recess 40R, the auxiliary wiring device XD is manually pivotable about the receiver axis RX relative to the terminal block BK such that the receiver axis RX defines or functions as a pivot axis for the auxiliary wiring device XD about which the auxiliary wiring device XD pivots relative to the terminal block BK portion of the terminal base TB.

Each of the resilient latch arms 50 of the auxiliary wiring device XD is adapted to mate with and engage a respective catch CT of the terminal base TB. In particular, the terminal base TB comprises one or more such catches CT that correspond respectively to the resilient latch arms 50. In the illustrated embodiment, the terminal base bottom wall TBW comprises a plurality of catches CT defined therein, wherein the catches CT of the illustrated embodiment are more particularly located in the bottom wall BW1 of the terminal base main body TBB. Each catch CT comprises a slot CS defined in the bottom wall TBW that is adapted to receive a respective latch arm 50. Each catch CT further comprises a transverse catch face CF (FIGS. 7A-7C) that intersects the catch slot CS that is arranged transversely relative to the catch slot CS so that the catch face CF intersects the slot CS at an angle.

Figure 7C:
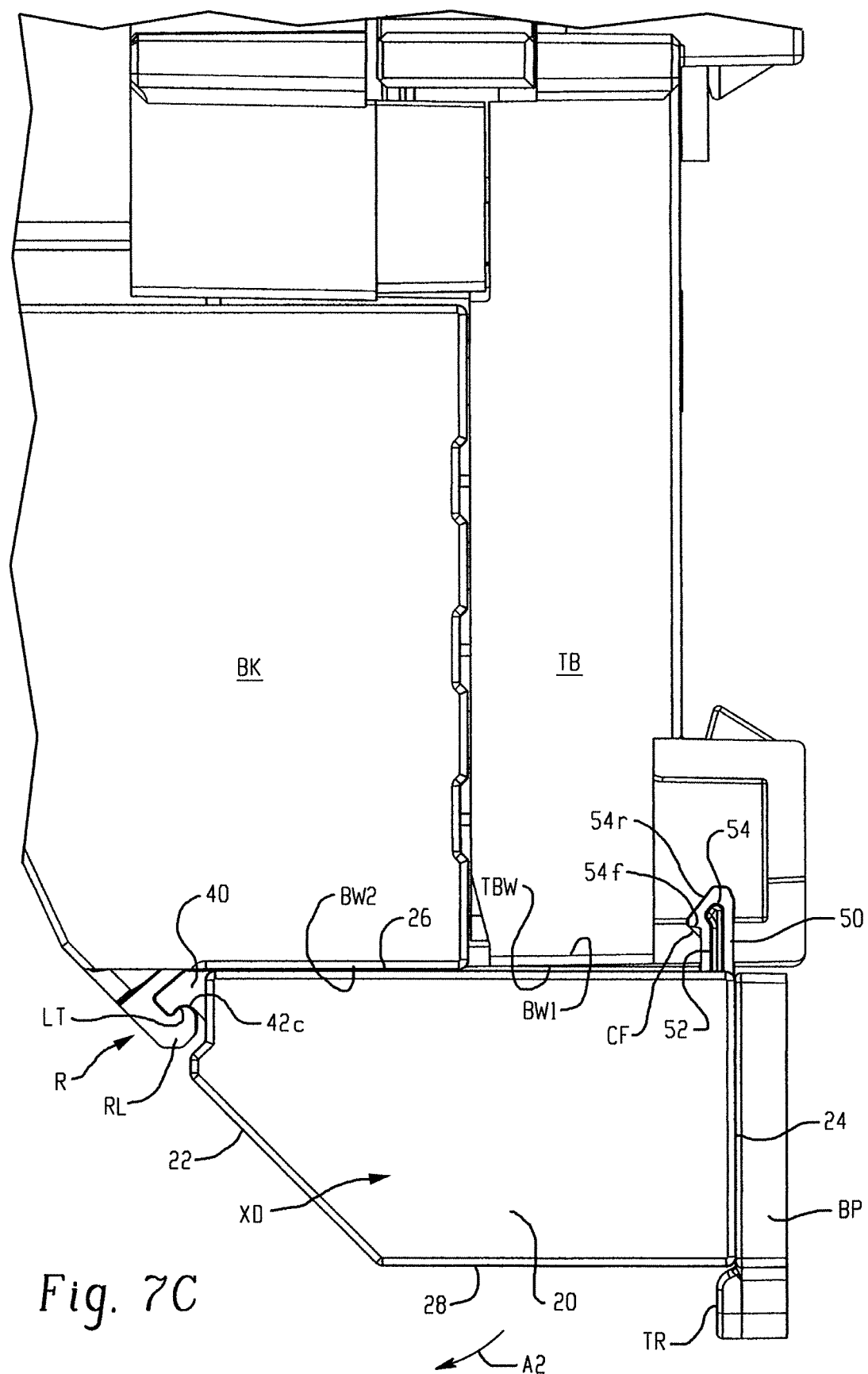

Installation of the auxiliary wiring device XD to the terminal block portion BK of the terminal base TB is shown in FIGS. 7A-7C. In an initial step shown in FIG. 7A, the auxiliary wiring device XD is located adjacent the terminal block BK and the mounting tabs 40 are aligned with the receiver R of the terminal base TB. As shown in FIG. 7B, the mounting tabs 40 are then inserted into the receiver pocket RP such that the tip LT of the projecting lip RL of the receiver R is received into the mounting tab recess 40R of the auxiliary wiring device and such that the tip LT is abutted with the concave inner face 42 of each mounting tab 40 to provide an installation position of the auxiliary wiring device XD.

As indicated by the arrow A1 in FIG. 7B, the auxiliary wiring device XD is then manually pivoted about the receiver (pivot) axis RX relative to the terminal block BK from the installation position (FIG. 7B) toward and into its operative position (FIG. 7C) such that the resilient latch arms 50 are each mated and engaged with a respective catch CT of the terminal base TB so that the auxiliary wiring device XD is fixedly secured to the terminal base TB in its operative position as shown in FIG. 7C. More specifically, when the auxiliary wiring device XD is pivoted toward its operative position in a first or installation direction as indicated by the arrow A1, the ramp face 54r of each resilient latch arm 50 contacts the catch CT, bottom wall TBW, and/or other part of the terminal base TB such that the resilient latch arm 50 is deflected sufficiently for its enlarged locking projection 54 to move into the catch slot CS and into alignment with the catch face CF. When the locking projection 54 is aligned with the catch face 54, the latch arm 50 resiliently returns at least toward and optionally fully to its undeflected state and position such that the locking projection 54 is engaged with the catch face CF and so that the latch arm 50 is mated and engaged with the respective catch CT for fixed securement of the auxiliary wiring device XD to the terminal base TB adjacent with bottom wall TBW so that the auxiliary wiring device XD is located in its operative position. When the latch arm 50 is mated with the catch CT, the locking projection 54 of the latch arm 50 is abutted and frictionally engaged with the catch face CF. When the auxiliary wiring device XD is operatively installed on the terminal base TB as shown in FIGS. 3 and 7C, the auxiliary wiring connectors XC thereof extend laterally along an auxiliary connector axis UX that is parallel to the longitudinal axis LX and parallel to the receiver axis RX of the terminal block BK.

The auxiliary wiring device XD is removed from the terminal base by reversing the above-noted installation steps, beginning with pivoting the auxiliary wiring device XD relative to the terminal base TB in a second (removal) direction A2 that is opposite the first (installation) direction A1 as shown in FIG. 7C. The catch face CF is preferably oriented such that the enlarged locking projection 54 of the respective latch arm 50 is frictionally engaged with the catch face CF when the latch arm 50 is mated with the catch CT, but also such that when the auxiliary wiring device XD is pivoted in the second direction A2, the catch face CF deflects the latch arm 50 away from the catch face CF to allow the latch arm 50 to disengage from the catch CT. Each latch arm 50 resiliently resumes its undeflected free state after it is disengaged from its respective catch CT.

To assist in removing the auxiliary wiring device XD from the terminal base TB, the body 20 of the auxiliary wiring device XD optionally includes a tool recess TR adapted to receive the blade of a tool such as a screwdriver that is used to pivot the auxiliary wiring device XD in the second direction A2 relative to the terminal base TB. The tool recess TR can be integrally formed as part of the body 20. In the illustrated embodiment, the auxiliary wiring device XD comprises a backing plate BP connected to the body 20 adjacent the rear wall 24 of the body, and the tool recess TR is provided or defined as part of the backing plate BP.

When operatively installed, the auxiliary wiring device XD provides a convenient location for auxiliary wiring connections for the field wires FW or other connections in a manner where the auxiliary wiring connectors XC are located adjacent the main wiring connectors of the terminal block BK. As noted, in one embodiment, all or some of the auxiliary wiring connectors XC are electrically connected together such that each auxiliary wiring connector XC is electrically common with the other auxiliary wiring connectors XC, or two or more of the auxiliary wiring connectors XC are alternatively electrically isolated from the other auxiliary wiring connectors XC.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. An auxiliary wiring device adapted to be releasably connected to an associated terminal base, said auxiliary wiring device comprising:

a body including a front wall, a rear wall, a top wall, a bottom wall, and opposite left and right lateral side walls;

a plurality of auxiliary wiring connectors adapted for connection to associated field device wires, said plurality of auxiliary wiring connectors located in said front wall of said body;

said body further including at least two spaced-apart mounting tabs that project outwardly from the body adjacent an intersection of said front wall and said top wall, wherein each mounting tab is adapted to engage a receiver of the associated terminal base when said auxiliary wiring device is physically connected to the associated terminal base, each mounting tab comprising (i) a concave cylindrical inner face oriented toward the plurality of auxiliary wiring connectors; and, (ii) an outer face facing in an opposite direction as compared to the concave cylindrical face, said outer face transversely oriented relative to the top wall of said body so as to be angled with respect to the top wall of said body;

said body further including at least two spaced-apart latch arms each adapted to mate with and engage a respective associated catch of the associated terminal base when said auxiliary wiring device is physically connected to the associated terminal base in an operative position, each latch arm projecting outwardly from the top wall of the body adjacent a region where said top wall intersects said rear wall, each latch arm comprising a resiliently deflectable stem that projects outwardly from the top wall and comprising an enlarged locking projection connected to an outer end of the stem at a location spaced from the top wall of the body, said locking projection comprising an inclined ramp face that diverges away from the stem as it extends from an outer end of the ramp face located adjacent said outer end of said stem toward an inner end of the ramp face located closer to the top wall of the body as compared to the outer end of the ramp face, said locking projection further comprising a transverse lock face oriented transversely relative to the stem and connecting the inner end of the ramp face to the stem at a location between the top wall of the body and the outer end of the stem, each latch arm resiliently elastically deflectable toward and away from the front and back walls of the body.

2. The auxiliary wiring device as set forth in claim 1, wherein said body further comprises a tool recess that is located adjacent the rear wall of the body and adapted to receive an associated tool used to pivot said auxiliary wiring device relative to the associated terminal base.

3. The auxiliary wiring device as set forth in claim 2, wherein said auxiliary wiring device comprises a backing plate connected to said rear wall of said body and wherein said tool recess is defined as part of the backing plate.

4. The auxiliary wiring device as set forth in claim 1, wherein at least some of said auxiliary wiring connectors of said auxiliary wiring device are electrically interconnected in common with each other.

5. The auxiliary wiring device as set forth in claim 1, wherein all of said auxiliary wiring connectors of said auxiliary wiring device are electrically interconnected in common with each other.

6. The auxiliary wiring device as set forth in claim 1, connected to the associated terminal base including a terminal block, said terminal block comprising a plurality of wiring connectors adapted for connection to associated field device wires.

7. The auxiliary wiring device as set forth in claim 6, wherein said auxiliary wiring device is selectively physically connectable to the associated terminal base in an operative position and selectively physically removable from the associated terminal base.

\* \* \* \* \*